US012762444B2

(12) United States Patent
Monroe et al.

(10) Patent No.: US 12,762,444 B2
(45) Date of Patent: Oct. 13, 2026

(54) GENERATION OF N-BODY ENTANGLING INTERACTIONS BETWEEN QUBITS

(71) Applicant: DUKE UNIVERSITY, Durham, NC (US)

(72) Inventors: Christopher Monroe, Durham, NC (US); Or Katz, Durham, NC (US); Marko Cetina, Durham, NC (US)

(73) Assignee: Duke University, Durham, NC (US)

( * ) Notice: Subject to any disclaimer, the term of this patent is extended or adjusted under 35 U.S.C. 154(b) by 914 days.

(21) Appl. No.: 18/059,550

(22) Filed: Nov. 29, 2022

(65) Prior Publication Data

US 2023/0196158 A1 Jun. 22, 2023

Related U.S. Application Data

(60) Provisional application No. 63/283,780, filed on Nov. 29, 2021.

(51) Int. Cl.

*G06N 10/20* (2022.01)
*G01R 33/00* (2006.01)
*G01R 33/12* (2006.01)
*G06N 10/00* (2022.01)

(52) U.S. Cl.

CPC ......... *G06N 10/20* (2022.01); *G01R 33/0029* (2013.01); *G01R 33/1284* (2013.01); *G06N 10/00* (2019.01)

(58) Field of Classification Search

CPC .... G06N 10/20; G06N 10/00; G01R 33/1284; G01R 33/0029
USPC ..... 505/170; 326/2; 716/100, 101, 104, 105, 716/106
See application file for complete search history.

(56) References Cited

U.S. PATENT DOCUMENTS

2021/0263390 A1* 8/2021 Beck ........................ G02F 1/113

OTHER PUBLICATIONS

Dylewsky et al, NPL citation: Exact Calculation of Phonon Effects on Spin Squeezing, arXiv:1510.05003v1 [cond-mat.quant-gas] Oct. 16, 2015.*

Cirac, Juan I., and Peter Zoller. "Quantum computations with cold trapped ions." Physical review letters 74.20 (1995): 4091.

J. D. Arias Espinoza, K. Groenland, M. Mazzanti, K. Schoutens, and R. Gerritsma, Phys. Rev. A 103, 052437 (2021).

Katz, Or, Marko Cetina, and Christopher Monroe. "N-body interactions between trapped ion qubits via spin-dependent squeezing." Physical Review Letters 129.6 (2022): 063603.

Leibfried, Dietrich, et al. "Quantum dynamics of single trapped ions." Reviews of Modern Physics 75.1 (2003): 281.

M. A. Nielsen and I. L. Chuang, Quantum Computation and Quantum Information (Cambridge University Press, Cambridge, UK, 2000).

Milburn, G. J., S. Schneider, and D. F. V. James. "Ion trap quantum computing with warm ions." Fortschritte der Physik: Progress of Physics 48.9-11 (2000): 801-810.

(Continued)

*Primary Examiner* — Arnold M Kinkead
(74) *Attorney, Agent, or Firm* — Barnes & Thornburg LLP

(57) ABSTRACT

Systems and methods for producing N-body entangling interactions to simplify n-gate operations in quantum computing applications are disclosed herein. According to at least some embodiments, an oscillator generates a two-tone field tuned to qubit resonance, first upper motion-induced sidebands, first lower motion-induced sidebands, second upper motion-induced sidebands, and second lower motion-induced sidebands.

19 Claims, 8 Drawing Sheets

(56) References Cited

OTHER PUBLICATIONS

Molmer, Klaus, and Anders Sorensen. "Schrodinger's cat in a hot trap." Phys. Rev. Lett. 82.arXiv: quant-ph/9810040 (1999): 1835-1838.

Solano, Enrique, Ruynet Lima de Matos Filho, and Nicim Zagury. "Deterministic Bell states and measurement of the motional state of two trapped ions." Physical Review A 59.4 (1999): R2539.

Wang, Xiaoguang, Anders Sørensen, and Klaus Mølmer. "Multibit gates for quantum computing." Physical review letters 86.17 (2001): 3907.

* cited by examiner

GENERATION OF N-BODY ENTANGLING INTERACTIONS BETWEEN QUBITS

CROSS-REFERENCE TO RELATED APPLICATIONS

This application claims benefit of priority from U.S. Provisional Application No. 62/283,780, filed Nov. 29, 2022, the disclosure of which is hereby incorporated by reference herein its entirety.

GOVERNMENT LICENSE RIGHTS

This invention was made with government support under 11IARPA1008 awarded by Intelligence Advanced Research Projects Activity (IARPA) and PHY1818914 awarded by National Science Foundation (NSF). The government has certain rights in the invention.

FIELD

The present disclosure generally relates to quantum computing, and more specifically to systems and methods for generating N-body entangling interactions to simplify gate operations in quantum computing applications.

BACKGROUND

In quantum computing, quantum bits or qubits, which are analogous to bits representing a "0" and a "1" in a classical (digital) computer, are prepared, manipulated, and measured with near-perfect control during a computation process. Imperfect control of the qubits leads to errors that can accumulate over the computation process, limiting the size of a quantum computer that can perform reliable computations. One proposed environment for the preparation and manipulation of qubits for large-scale quantum computing applications is a trapped ion structure.

In such a system, a chain of ions (e.g., charged atoms), are trapped and suspended in vacuum by electromagnetic fields. The ions have internal hyperfine states, defined by minute changes in degenerate energy levels of those ions. These minute changes split the degenerate energy levels of the ions and are separated by frequencies in the several GHz range. These frequencies can be used as the computational states of a qubit (referred to as "qubit states"). As a result of their origins based on degenerate energy level, the hyperfine states can be controlled using energy changes prompted by a radiation source such as a laser.

The ions can be cooled to near their motional ground states using laser interactions. The ions can also be optically pumped to one of the two hyperfine states with high accuracy corresponding to the preparation of qubits. The ions can be similarly manipulated between the two hyperfine states to perform a single-qubit gate operation. Then, the internal hyperfine states of the ions can be detected to readout the qubits; one such method of detection is reading fluorescence triggered by application of a resonant laser beam. To perform a two-qubit gate operation, a trapped ion system can controllably entangle a pair of ions. This can be accomplished through qubit state dependent force using laser pulses that couple the ions to the collective motional modes of a chain of trapped ions, which arise from their Coulombic interaction between the ions.

In general, entanglement occurs when pairs or groups of particles (such as the trapped ions) interact. Such interactions include scenarios where these ions share spatial proximity in ways such that the quantum state of each ion cannot be described independently of the quantum state of the others. This entanglement by interaction remains, even when the ions are later separated by a large distance. As the size of a quantum computer increases, implementation of two-qubit gate operations between a pair of ions becomes a more complex process. This has a multiplicative effect on the errors associated with the devices, such as laser powers, used to implement the desired state of the trapped ions.

Accordingly, to increase the size of a quantum computer capable of solving problems otherwise intractable in classical computer, there is a need for procedures to accurately control qubits to perform a desired computation process while using minimum resources.

The description provided in the background section should not be assumed to be prior art merely because it is mentioned in or associated with the background section. The background section may include information that describes one or more aspects of the subject of the technology.

SUMMARY

According to at least one embodiment, a method for generating N-body entangling interactions between trapped atomic ion qubits is proposed. In this embodiment, a field generated by an oscillator drives the qubit transition and/or the qubit's collective motion.

In at least some embodiments, the oscillator generates a single-tone or multi-tone field driving the qubit between its quantum states. The oscillator can additional generate a single-tone or multi-tone field driving the motion of the qubit. The oscillator can additionally generate a multi-tone field driving the qubit's first upper motion-induced sidebands and first lower motion-induced sidebands. The oscillator can additionally generate a multi-tone field driving the qubit's second upper motion-induced sidebands, and second lower motion-induced sidebands.

According to at least some embodiments, N-body entangling interactions are generated by applications of displacement forces in combination with qubit state-dependent squeezing forces. In other or the same embodiments, N-body entangling interactions are generated by applications of qubit state-dependent squeezing forces. In some embodiments, the application of displacements occurs simultaneously with an application of qubit state-dependent squeezing.

According to some embodiments of the present disclosure, the generator of the displacement operator is given by $H_D=\hbar A(x \text{ Sin } \phi_D+p \text{ COS } \phi_D)$. The generator of a squeezing operator can be given by $H_S=(e^{-i\delta_\phi}\hat{\alpha}^2-e^{i\delta_\phi}\hat{\alpha}^{\dagger 2})$ according to some embodiments.

In another embodiment of a quantum computing system, N-body entangling interactions between trapped atomic ion qubits in a field are generated by an oscillator. That quantum computing system may comprise a quantum circuit having a plurality of qubits, each of the qubits defined by two eigenstate levels of the qubit system. A quantum computing system may further comprise one or more classical computing processors, as well as a memory storing program code, which, when executed by the one or more processors, causes the quantum computing system to generate the quantum state of one or more of the plurality of qubits.

In at least some of such embodiments, the oscillator generates a two-tone field tuned to qubit resonance, first upper motion-induced sidebands, first lower motion-induced sidebands, second upper motion-induced sidebands, and second lower motion-induced sidebands of field. In at least some of such embodiments, a frequency adjustment mechanism is configured to tune the frequencies of the two-tone field to be detuned from the qubit resonance by twice the motional frequencies of a mode of the oscillator.

In some embodiments, N-body entangling interactions are generated by a sequence of displacements that may or may not be qubit state-dependent and qubit state-dependent squeezing. The application of displacements can occur simultaneously with an application of qubit state-dependent squeezing. In some embodiments, the generator of the displacement operator is given by $H_D=\hbar A(x \sin \phi_D+p \cos \phi_D)$. In other or the same embodiments, the generator of the squeezing operator is given by $H_S=(e^{-i\delta_\phi}\hat{\alpha}^2-e^{i\delta_\phi}\hat{\alpha}^{\dagger 2})$.

Individuals will appreciate the scope of the disclosure and realize additional aspects thereof after reading the following detailed description of the examples in association with the accompanying drawing FIGURES.

BRIEF DESCRIPTION OF THE DRAWINGS

The drawing FIGURES depict one or more implementations in accord with the present teachings, by way of example only, not by way of limitation. In the FIGURES, like reference numerals refer to the same or similar elements.

DETAILED DESCRIPTION

Figure 1:
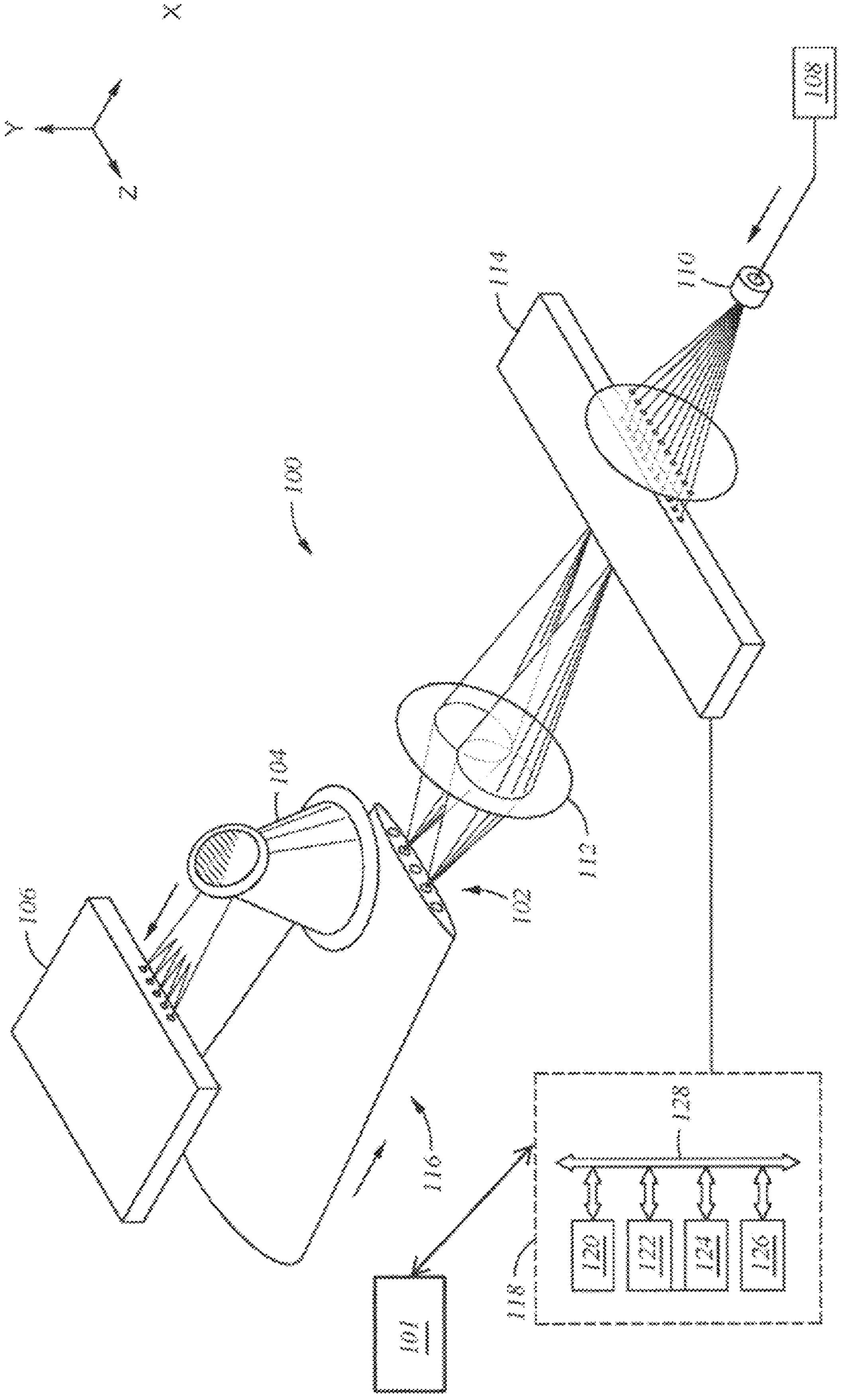
FIG. 1 depicts a partial view of an ion trap quantum computer, according to an embodiment.

In classical computing systems, a 2-bit NAND gate forms the basis of a processing system. While computations can generally be performed using NAND and other 2-bit operations, n-bit gates in a quantum computing system are capable of performing computing tasks that would require large numbers of 2-bit gates. For instance, a 20-bit gate, wherein the 20th qubit is spin-down only when the remaining 19 qubits are spin-up, can be replicated using hundreds of 2-bit gates, rather than a single 20-bit gate. Accordingly, there is room in the art for using and generating n-bit gates in quantum computing structures for rapidly performing complex calculations.

Embodiments presented herein disclose a system and techniques for generating an N-body entangling interaction between qubits, such as trapped atomic ion qubits. Particularly, embodiments describe performing, within a quantum computing system, qubit state-dependent squeezing operations between qubits in a state-dependent manner. A quantum computing system, such as a trapped ion quantum computer, may generate fields used to drive a qubit between its quantum states, motion, and motion-induced sidebands to achieve such interactions. By driving qubit state-dependent forces near the first and second side-bands, the resulting displacement and squeezing operations enable the formation of families of spin-entangling gates that implement interaction between N bodies while being robust to thermal motion of the ions.

Although prior approaches have applied squeezing that is independent of the qubit state to improve performance of pairwise gate operations, the present approach leverages the qubit state-dependent squeezing to generate N-body entangling interactions, as will be further described herein. Advantageously, the quantum computing system, in generating N-body entangling interactions, may have additional control over the interacting qubits, allowing for more efficient, faster, and scalable computing operations. For instance, time-dependent squeezing may act simultaneously on multiple motional modes of a trapped ion chain. Further, qubit state-dependent squeezing renders the response of the ion chain to standard electric fields nonlinear in spin operators, generating controllable spin Hamiltonians after decoupling the spins from the motional phonon state of a crystal.

To that end, the evolution of the ions spin and motional states creates a toolbox of effective spin Hamiltonians and quantum gates for a quantum computing system to use in a variety of applications. For example, the quantum computing system may perform more efficiently in continuous variable quantum information operations or in other physical systems manifesting coupling between spins and bosonic modes that act as a quantum bus (e.g., superconducting circuits embedded in microwave cavities or arrays of neutral atoms in optical cavities). As another example, the quantum computing system may construct an N-body stabilizer operator composed of a product of N spin operators, as well as extensions of the N-bit Toffoli gate using multiple modes.

In the following detailed description, numerous specific details are set forth by way of examples in order to provide a thorough understanding of the relevant teachings. However, it should be apparent to those skilled in the art that the present teachings may be practiced without such details. In other instances, well-known methods, procedures, components, and/or circuitry have been described at a relatively high-level, without detail, in order to avoid unnecessarily obscuring aspects of the present disclosure.

While this disclosure includes a number of embodiments in many different forms, particular embodiments will be described in greater detail with the understanding that the present disclosure is to be considered as an exemplification of the principles of the disclosed methods and systems, and is not intended to limit the broad aspects of the disclosed concepts to the embodiments illustrated. As will be realized, the subject technology is capable of other and different configurations, several details are capable of modification in various respects, embodiments may be combine, steps for installation may be omitted or performed in a different order, all without departing from the scope of the subject technology. Accordingly, the drawings and detailed description are to be regarded as illustrative in nature and not as restrictive.

FIG. 1 is a partial view of an example ion trap quantum computer, or system 100, that generates N-body entangling interactions between trapped ion qubits, according to an embodiment. The system 100 includes a classical (digital) computer 101, a system controller 118 and a quantum register that is a chain 102 of trapped ions (i.e., five shown) that extend along the Z-axis. The classical computer 101 includes a central processing unit (CPU), memory, and support circuits (or I/O). The memory is connected to the CPU, and may be one or more of a readily available memory, such as a read-only memory (ROM), a random access memory (RAM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like.

An imaging objective 104, such as an objective lens with a numerical aperture (NA), for example, of 0.37, collects fluorescence along the Y-axis from the ions and maps each ion onto a multi-channel photo-multiplier tube (PMT) 106 for measurement of individual ions. Non-copropagating Raman laser beams from a laser 108, which are provided along the X-axis, perform operations on the ions. A diffractive beam splitter 110 creates an array of static Raman beams 112 that are individually switched using a multi-channel acousto-optic modulator (AOM) 114 and is configured to selectively act on individual ions. A global Raman laser beam 116 illuminates all ions at once. The system controller (also referred to as a "RF controller") 118 controls the AOM 114. The system controller 118 includes a central processing unit (CPU) 120, a read-only memory (ROM) 122, a random access memory (RAM) 124, a storage unit 126, and the like. The CPU 120 is a processor of the RF controller 118. The ROM 122 stores various programs and the RAM 124 is the working memory for various programs and data. The storage unit 126 includes a nonvolatile memory, such as a hard disk drive (HDD) or a flash memory, and stores various programs even if power is turned off. The CPU 120, the ROM 122, the RAM 124, and the storage unit 126 are interconnected via a bus 128. The RF controller 118 executes a control program which is stored in the ROM 122 or the storage unit 126 and uses the RAM 124 as a working area. The control program will include software applications that include program code that may be executed by processor in order to perform various functionalities associated with receiving and analyzing data and controlling any and all aspects of the methods and hardware used to create the ion trap quantum computer system 100 discussed herein.

Figure 2:
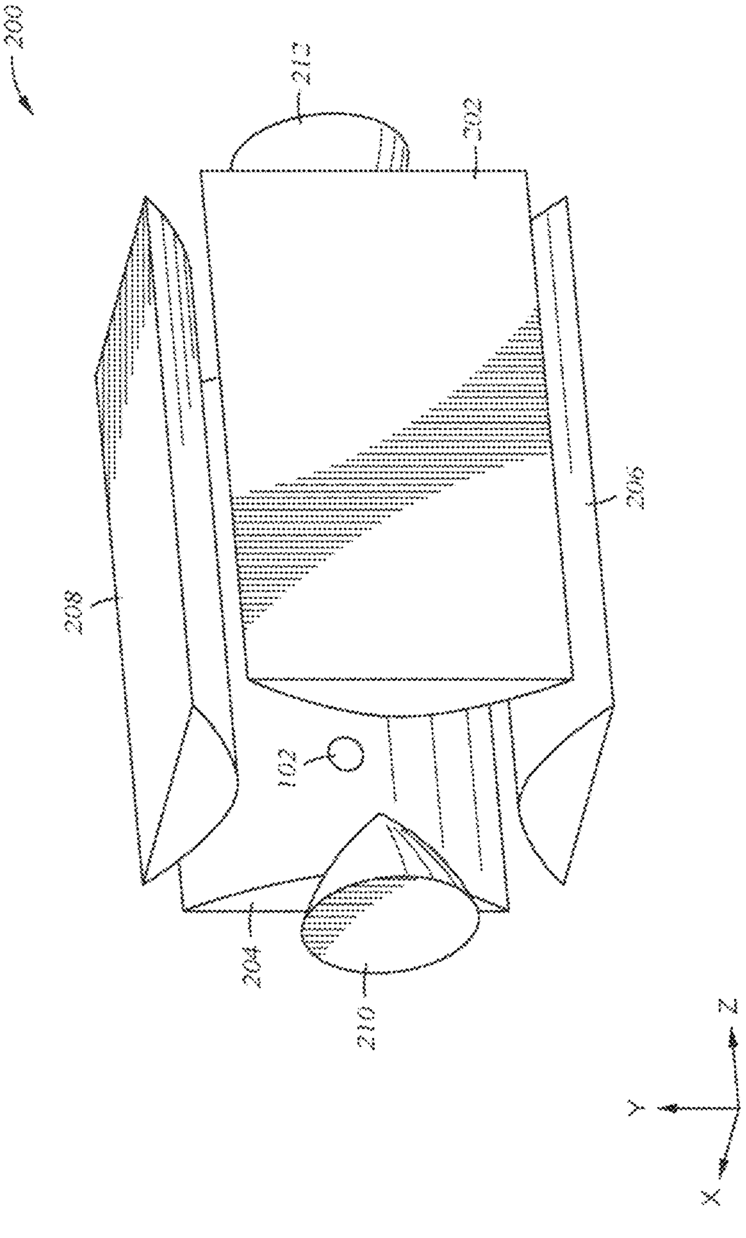
FIG. 2 depicts a schematic view of an ion trap for confining ions in a chain, according to an embodiment.

FIG. 2 depicts a schematic view of an ion trap 200 (also referred to as a Paul trap) for confining ions in the chain 102, according to an embodiment. The confining potential is exerted by both static (DC) voltage and radio frequency (RF) voltages. A static (DC) voltage vs is applied to end-cap electrodes 210 and 212 to confine the ions along the Z-axis (also referred to as an "axial direction" or a "longitudinal direction"). The ions in the chain 102 are nearly evenly distributed in the axial direction due to the Coulomb interaction between the ions. In some embodiments, the ion trap 200 includes four hyperbolically-shaped electrodes 202, 204, 206, and 208 extending along the Z-axis.

During operation, a sinusoidal voltage $V_1$ (with an amplitude $V_{RF}/2$) is applied to an opposing pair of the electrodes 202, 204 and a sinusoidal voltage $V_2$ with a phase shift of 180° from the sinusoidal voltage $V_1$ (and the amplitude $V_{RF}/2$) is applied to the other opposing pair of the electrodes 206, 208 at a driving frequency $\overline{\omega}_{RF}$, generating a quadrupole potential. In some embodiments, a sinusoidal voltage is only applied to one opposing pair of the electrodes 202, 204, and the other opposing pair 206, 208 is grounded.

The quadrupole potential creates an effective confining force in the X-Y plane perpendicular to the Z-axis (also referred to as a "radial direction" or "transverse direction") for each of the trapped ions, which is proportional to a distance from a saddle point (i.e., a position in the axial direction (Z-direction)) at which the RF electric field vanishes. The motion in the radial direction (i.e., direction in the X-Y plane) of each ion is approximated as a harmonic oscillation (referred to as secular motion) with a restoring force towards the saddle point in the radial direction and can be modeled by spring constants $k_x$ and $k_y$, respectively, as is discussed in greater detail below. In some embodiments, the spring constants in the radial direction are modeled as equal when the quadrupole potential is symmetric in the radial direction.

However, undesirably in some cases, the motion of the ions in the radial direction may be distorted due to some asymmetry in the physical trap configuration, a small DC patch potential due to inhomogeneity of a surface of the electrodes, or the like and due to these and other external sources of distortion the ions may lie off-center from the saddle points.

Figure 3:
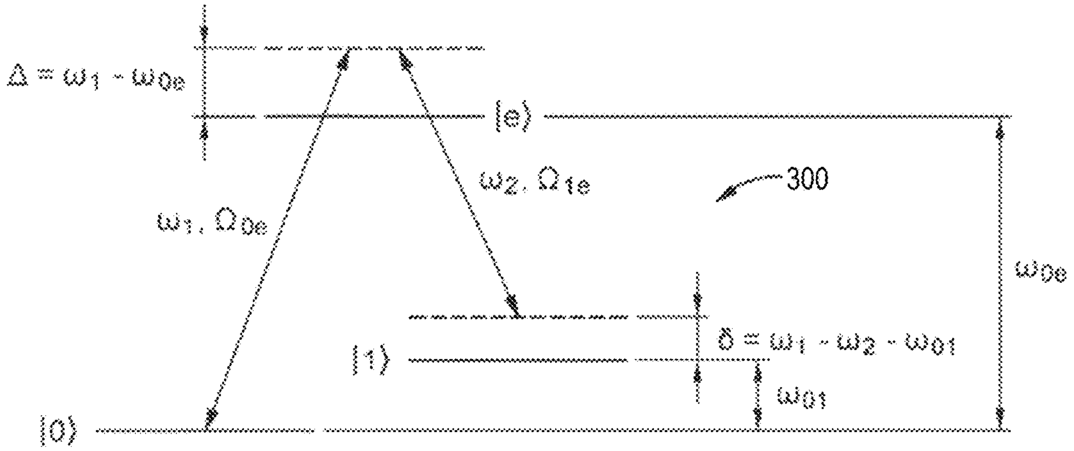
FIG. 3 depicts a schematic energy diagram of each ion in a chain of trapped ions, according to an embodiment.

FIG. 3 depicts a schematic energy diagram 300 of each ion in the chain 102 of trapped ions, according to an embodiment. In one example, each ion may be a positive Ytterbium ion, $^{171}Yb^+$, which has the $^2S_{1/2}$ hyperfine states (i.e., two electronic states) with an energy split corresponding to a frequency difference (referred to as a "carrier frequency") of $\omega_{01}/2\pi$=12.642821 GHz. A qubit is formed with the two hyperfine states, denoted as $|0\rangle$ and $|1\rangle$ where the hyperfine ground state (i.e., the lower energy state of the $^2S_{1/2}$ hyperfine states) is chosen to represent $|0\rangle$. Hereinafter, the terms "hyperfine states," "internal hyperfine states," and "qubits" may be interchangeably used to represent $|0\rangle$ and $|1\rangle$. Each ion may be cooled (i.e., kinetic energy of the ion may be reduced) to near the motional ground state $|0\rangle$, for any motional mode p with no phonon excitation (i.e., $n_{ph}=0$) by known laser cooling methods, such as Doppler cooling or resolved sideband cooling, and then the qubit state prepared in the hyperfine ground state $|0\rangle$ by optical pumping. Here, $|0\rangle$ represents the individual qubit state of a trapped ion whereas $|0\rangle$, with the subscript p denotes the motional ground state for a motional mode p of a chain 102 of trapped ions.

An individual qubit state of each trapped ion may be manipulated by, for example, a mode-locked laser at 355 nanometers (nm) via the excited $^2P_{1/2}$ level (denoted as $|e\rangle$). As shown in FIG. 3, a laser beam from the laser may be split into a pair of non-copropagating laser beams (a first laser beam with frequency $\omega_1$ and a second laser beam with frequency $\omega_2$) in the Raman configuration, and detuned by a one-photon transition detuning frequency $\Delta=\omega_1-\omega_{0e}$, with respect to the transition frequency $\omega_{0e}$ between $|0\rangle$ and $|e\rangle$, as illustrated in FIG. 3. A two-photon transition detuning frequency $\delta$ includes adjusting the amount of energy that is provided to the trapped ion by the first and second laser beams, which when combined is used to cause the trapped ion to transfer between the hyperfine states $|0\rangle$ and $|1\rangle$. When the one-photon transition detuning frequency $\Delta$ is much larger than a two-photon transition detuning frequency (also referred to simply as "detuning frequency") $\delta=\omega_1-\omega_2-\omega_{01}$ (hereinafter denoted as $+\mu$, $\mu$ being a positive value), single-photon Rabi frequencies $\Omega_{0e}(t)$ and $\Omega_{1e}(t)$ (which are time-dependent, and are determined by amplitudes and phases of the first and second laser beams), at which Rabi flopping between states |0⟩ and |e⟩ and between states |1⟩ and |e⟩ respectively occur, and a spontaneous emission rate from the excited state |e⟩, Rabi flopping between the two hyperfine states |0⟩ and |1⟩ (referred to as a "carrier transition") is induced at the two-photon Rabi frequency Ω(t). The two-photon Rabi frequency Ω(t) has an intensity (i.e., absolute value of amplitude) that is proportional to $\Omega_{0e}\Omega_{1e}/2\Delta$, where $\Omega_0$, and $\Omega_{1e}$ are the single-photon Rabi frequencies due to the first and second laser beams, respectively. Hereinafter, this set of non-copropagating laser beams in the Raman configuration to manipulate internal hyperfine states of qubits (qubit states) may be referred to as a "composite pulse" or simply as a "pulse," and the resulting time-dependent pattern of the two-photon Rabi frequency Ω(t) may be referred to as an "amplitude" of a pulse or simply as a "pulse," which are illustrated and further described below. The detuning frequency $\delta=\omega_1-\omega_2-\omega_{01}$ cool may be referred to as detuning frequency of the composite pulse or detuning frequency of the pulse. The amplitude of the two-photon Rabi frequency Ω(t), which is determined by amplitudes of the first and second laser beams, may be referred to as an "amplitude" of the composite pulse.

It should be noted that the particular atomic species used in the discussion provided herein is just one example of atomic species which has stable and well-defined two-level energy structures when ionized and an excited state that is optically accessible, and thus is not intended to limit the possible configurations, specifications, or the like of an ion trap quantum computer according to the present disclosure. For example, other ion species include alkaline earth metal ions (Be+, Ca+, Sr+, Mg+, and Ba+) or transition metal ions (Zn+, Hg+, Cd+).

Figure 4:
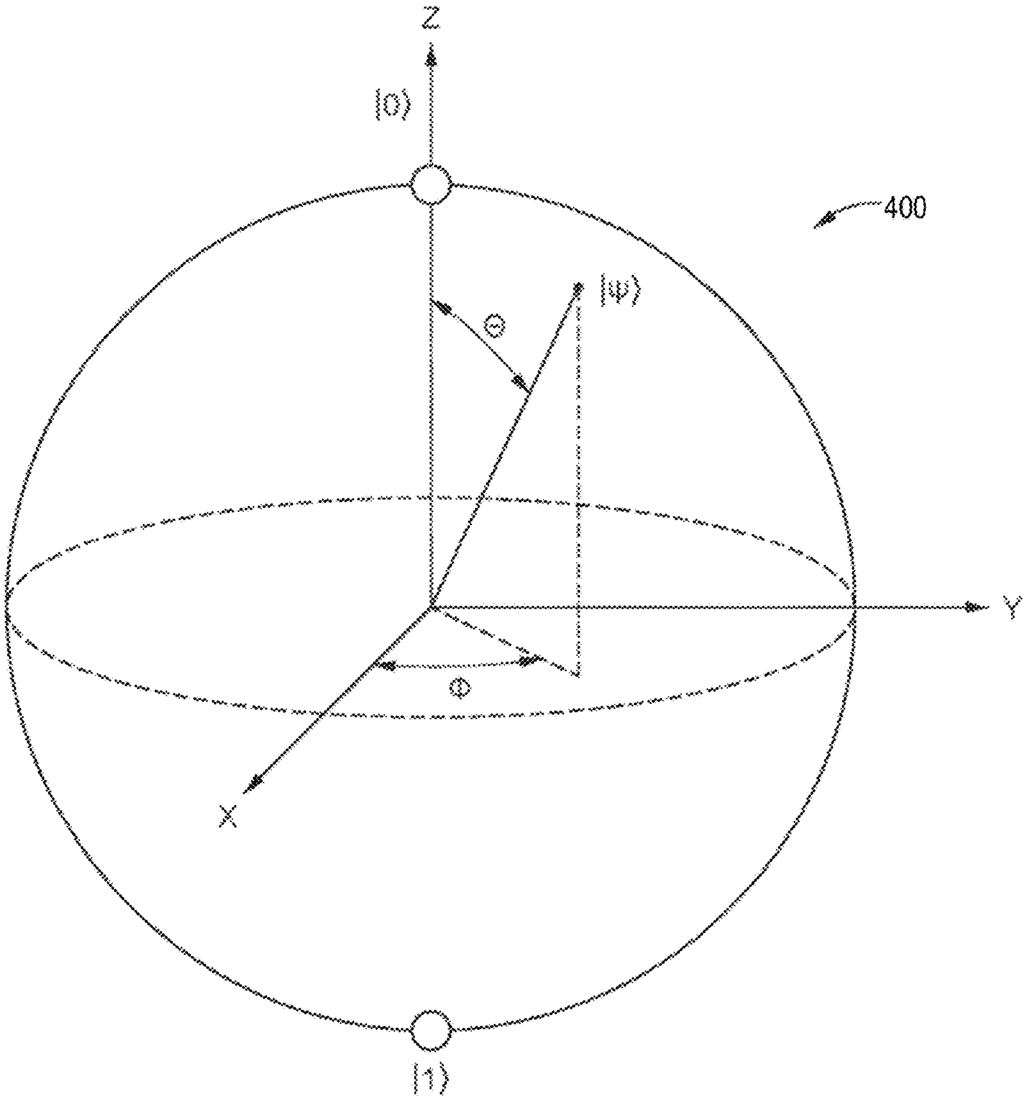
FIG. 4 depicts a qubit state of an ion represented as a point on a surface of the Bloch sphere, according to an embodiment.

FIG. 4 is provided to help visualize a qubit state of an ion is represented as a point on a surface of the Bloch sphere 400 with an azimuthal angle and a polar angle θ. Application of the composite pulse as described above, causes Rabi flopping between the qubit state |0⟩ (represented as the north pole of the Bloch sphere) and |1⟩ (the south pole of the Bloch sphere) to occur. Adjusting time duration and amplitudes of the composite pulse flips the qubit state from |0⟩ to |1⟩ (i.e., from the north pole to the south pole of the Bloch sphere), or the qubit state from |1⟩to 10⟩ (i.e., from the south pole to the north pole of the Bloch sphere). This application of the composite pulse is referred to as a "n-pulse". Further, by adjusting time duration and amplitudes of the composite pulse, the qubit state |0⟩ may be transformed to a superposition state |0⟩+|1⟩, where the two qubit states |0⟩ and |1⟩ are added and equally-weighted in-phase (a normalization factor of the superposition state is omitted hereinafter without loss of generality) and the qubit state |1⟩ to a superposition state |0⟩-|1⟩, where the two qubit states |0⟩ and |1⟩ are added equally-weighted but out of phase. This application of the composite pulse is referred to as a "π/2-pulse". More generally, a superposition of the two qubits states |0⟩ and |1⟩ that are added and equally-weighted is represented by a point that lies on the equator of the Bloch sphere. For example, the superposition states |0⟩+|1⟩ correspond to points on the equator with the azimuthal angle ϕ being zero and π, respectively. The superposition states that correspond to points on the equator with the azimuthal angle ϕ are denoted as $|0\rangle+e^{i\Phi}|1\rangle$ (e.g., |0⟩±i|1⟩ for ϕ=±π/2). Transformation between two points on the equator (i.e., a rotation about the Z-axis on the Bloch sphere) can be implemented by shifting phases of the composite pulse.

In an ion trap quantum computer, the motional modes may act as a data bus to mediate entanglement between two qubits and this entanglement is used to perform an XX gate operation. That is, each of the two qubits is entangled with the motional modes, and then the entanglement is transferred to an entanglement between the two qubits by using motional sideband excitations.

In a quantum computing system (e.g., the system 100), internal electronic energy levels of individual ions can be used as qubits or effective spins that can be efficiently prepared, controlled, and measured with high isolation from the environment. When trapped ions are laser-cooled and ordered into long chains, their Coulomb interaction gives rise to collective modes of motion between the ions. With the addition of optical or near-field microwave driving fields, the resultant force can depend upon the quantum spin state of the ions, thus generating spin-spin entanglement and allowing for control over their many-body quantum state. According to some embodiments of the present systems and methods, the system 100 may generate a native N-body interaction between trapped ion spins by squeezing a single vibrational mode of motion in a state-dependent manner.

In other or the same embodiments, the system 100 synchronously applies optical qubit state-dependent forces at twice the motional frequency of a particular vibrational mode of motion, which results in a family of N-body entangling interactions and gates that can be realized in a single step. According to at least some embodiments, these interactions are coupled to multiple motional modes in a trapped ion crystal rather than exclusively optical qubit state-dependent forces.

In at least some embodiments, time-dependent squeezing may act simultaneously on multiple motional modes of a trapped ion chain. The evolution of the ions spin and motional states creates a number of effective spin Hamiltonians and quantum gates for the system 100 to use in various operations. At least some embodiments utilize these spin Hamiltonians and quantum gates to achieve multimode squeezing and displacement forces to demonstrate particular applications, including the construction of an N-body stabilizer operator composed of a product of N spin operators, as well as extensions of the N-bit Toffoli gate using multiple modes.

At least some embodiments use a unitary evolution operator, which, after some time T, corresponds to the action of an effective spin Hamiltonian manifesting high-order interactions. Because the motional state is prone to heating, dephasing, and initialization errors, high fidelity manipulation of the spins usually requires the evolution to be insensitive to the initial motional state, as well as the erasure of correlations that are developed between spins and motion during the evolution. These issues present a challenge to simultaneously engineer useful qubit state-dependent interactions on while disentangling the states of motion and spins.

As stated, quantum computing systems generally include some sort of measurable quantum system, coupled to a classical computer for manipulating and measuring the results of that system. According to some embodiments of a quantum computing systems, including trapped-ion systems, qubits are configured using models based on classical oscillators. In general, analysis of n-bit systems separates an oscillator, which manipulates quantum qubits, from the qubits themselves, having induced and measured states. According to at least some embodiments, qubits can be manipulated using RF, microwave, or optical fields.

In an exemplary embodiments of a quantum computing system, such as system 100, an oscillator generates N-body entangling interactions between trapped atomic ion qubits in a field. The quantum system manipulated by that oscillator is in the form of a quantum circuit having a plurality of qubits, each of the qubits defined by two eigenstate levels of the qubit system. The manipulation of the oscillator and field is directed by one or more classical computing processors, as well as a memory storing program code, which, when executed by the one or more processors, causes the quantum computing system to generate the quantum state of one or more of the plurality of qubits.

An oscillator can generate a two-tone field tuned to a resonance frequency of the target qubits. The oscillator may also manipulate first upper motion-induced sidebands, first lower motion-induced sidebands, second upper motion-induced sidebands, and second lower motion-induced sidebands of the field. A frequency adjustment mechanism, such as a Reimann laser, is configured to tune the frequencies of the two-tone field. According to some embodiments, the field is detuned from the qubit resonance by twice the motional frequencies of a mode of the oscillator.

N-body entangling interactions can be generated in such systems by a sequence of displacements and qubit state-dependent squeezing. The application of displacements can occur simultaneously with an application of qubit state-dependent squeezing. In some embodiments, the generator of the displacement operator is given by $H_D=\hbar A(x \sin \phi_D+p \cos \phi_D)$. In other or the same embodiments, the generator of the squeezing operator is given by $H_S=(e^{-i\delta_\phi}\hat{\alpha}-\hat{\alpha}^2-e^{i\delta_\phi}\hat{\alpha}^{\dagger 2})$.

According to at least some embodiments, qubits are manipulated according to displacement within the field, though in other embodiments the qubits can be manipulated according to quantum squeezing.

As stated, the system 100 may generate N-body entangling interactions between trapped atomic ion qubits. In an embodiment, an oscillator of the system 100 may generate a field which may drive the qubit transition and collective motion. For instance, the oscillator may generate a single-tone or multi-tone field driving the qubit between its quantum states. The oscillator may also generate a single-tone or multi-tone field driving the motion of the qubit, a multi-tone field driving the first upper motion-induced sidebands and first lower motion-induced sidebands of the qubit, and a multi-tone field driving the qubit's second upper motion-induced sidebands and second lower motion-induced sidebands.

The system 100 may drive the qubit based on the aforementioned fields and apply displacement forces to generate N-body entangling interactions. In other or the same embodiments, the system 100 may generate the N-body entangling interactions by applying qubit state-dependent squeezing forces. In some embodiments, the system 100 may simultaneously apply displacements with qubit state-dependent squeezing. According to some embodiments of the present disclosure, the generator of the displacement operator is expressed as $H_D=\hbar A(x \sin \phi_D+p \cos \phi_D)$. Further according to some embodiments, the generator of a squeezing operator is expressed $H_S=(e^{-i\delta_\phi}\hat{\alpha}^2-e^{i\delta_\phi}\hat{\alpha}^{\dagger 2})$.

The following calculations are provided to illustrate at least some operations of a trapped ion quantum computer. Equation S1 represents the Hamiltonian operator. As known, a Hamilton operator is a mathematical construct representing the total energy of a quantum mechanical system. Equation S1 represents the energy of the system of interacting ions, such as those found in the ion trap of FIG. 2:

$$H_0 = \hbar\sum_{i=1}^{K} \omega_z\sigma_z^{(i)} + \hbar\sum_{k=1}^{K} \omega_k\left(a_k^\dagger a_k + \frac{1}{2}\right) \tag{S1}$$

In the above expression and throughout this description, i represents an individual ion number while k denotes a motional mode. From this operator, one can derive a spin independent displacement Hamiltonian, represented herein as $H_D$. Using the reference frame of the laboratory, where the z direction is the axis of the trap 200 and the x direction is the direction of gate application, the displacement Hamiltonian is given by S2 below:

$$\tilde{H}_D = \sum_{i=1}^{N} eE_x(z_{0i}, t)x_i(t) \tag{S2}$$

In equation S2, $z_{0i}$ is the equilibrium axial position of the ith ion in the trap 200 along the axis of the trap 200, while function $x_i(t)$ describes the ion motion transverse to the trap axis. The ion transverse motion with respect to the trap 200 may be expressed as:

$$x_i = \sqrt{\frac{2\hbar}{M\omega_k}} \cdot \frac{b_{ik}}{2} \cdot \left(a_k + a_k^\dagger\right) \tag{S3}$$

In equation S3, $b_{ik}$ represents the mode participation coefficient of the ith ion in the kth motional mode. As known, the interaction picture, or Dirac picture, of quantum mechanics entails both the state vector and the operators carry pieces of the time dependence of observables. Using the interaction picture enables the solution to the N-body Schrodinger equation to be expressed as a combination of the solution to the free-particle problem and remaining interaction parts. To generalize the interaction picture, the system 100 performs a unitary transformation of the Hamiltonian as split into its time independent and time dependent components as understood by one of skill in the art. This transformation by $$Uo = \exp\left[-\frac{i}{h}H_0 t\right]$$

is shown below as S4:

$$\begin{aligned} H_D \to U_0^\dagger \tilde{H}_D U_0 = {} & \\ & e^{i\sum_{m=1}^{K}\omega_m a_m^\dagger a_m t}\left[\sum_{i=1}^{N}\sum_{k=1}^{N} eE_0(z_{0i}, t)\sin(\omega_m t + \varphi_D)\sqrt{\frac{2\hbar}{M\omega_k}}\frac{b_{ik}}{2}\left(a_k + a_k^\dagger\right)\right] \\ & e^{-i\sum_{l=1}^{K}\omega_l a_l^\dagger a_l t} = \sum_{i=1}^{N}\sum_{k=1}^{N} eE_0(z_{0i}, t)\sin(\omega_m t + \varphi_D)\frac{b_{ik}}{2} \\ & \sqrt{\frac{2\hbar}{M\omega_k}}\left[e^{i\omega_k a_k^\dagger a_k t}\left(a_k + a_k^\dagger\right)e^{-i\omega_k a_k^\dagger a_k t}\right] = \sum_{i=1}^{N}\sum_{k=1}^{N} eE_0(z_{0i}, t) \\ & \sqrt{\frac{2\hbar}{M\omega_k}}\frac{b_{ik}}{4i}\left(e^{i(\omega_m t+\varphi_D)} - e^{-i(\omega_m t+\varphi_D)}\right)\left[a_k e^{-i\omega_k t} + a_k^\dagger e^{i\omega_k t}\right] \end{aligned} \tag{S4}$$

For context, calculation S4 uses relation S5:

$$e^{i\omega_k \alpha_k^\dagger \alpha_k}(\alpha_k)e^{-i\omega_k \alpha_k^\dagger \alpha_k} = e^{-i\omega_k t}\alpha_k \tag{S5}$$

Relation S5 is derived from formula S6:

$$e^{A}Be^{-A} = B + \sum_{p=1}^{\infty}\frac{1}{p!}[A, B]_p \tag{S6}$$

where $[A,B]_p$ denotes the "p"th order commutator as shown in S7:

$$[A,B]_p=[A,[A,B]_{p-1}] \tag{S7}$$

and where $A=i\omega_k\ \alpha_k^{\dagger}\alpha_k$ and $B=\alpha_k$ as understood by one of skill in the art.

Assuming $E_0(t)$ changes slowly with respect to the change of the motional frequencies, the fast oscillating terms in S4 are treated as de minimis, resulting in relation S8:

$$H_D \approx \sum_{i=1}^{N} eE_0(z_{0i}, t)\sqrt{\frac{2\hbar}{M\omega_k}}\frac{b_{ik}}{4i}\left(a_k e^{i\varphi_D} + a_k^{\dagger}e^{i\varphi_D}\right) = \hbar A(t)(\sin\varphi_D x_k + \cos\varphi_D p_k) \tag{S8}$$

wherein the coupling strength is given by S9:

$$\hbar A = \sqrt{\frac{\hbar}{2M\omega_k}}\sum_{i=1}^{N} eE_0(z_{0i}, t)b_{ik} \tag{S9}$$

Equation S8 accordingly provides the Hamiltonian for ions in a field $\vec{E}(r)=\vec{E}_0(r)\ \sin(\omega t+\varphi_D)$, oscillating at the resonance frequency of a mode j along the field direction.

In addition to the spin independent displacement Hamiltonian $H_D$, the system 100 may also determine the qubit state-dependent squeezing Hamiltonian $H_s$ from the inion-photon interaction Hamiltonian in the interaction picture (Dirac picture), the advantages of which for purposes of N-body calculations are discussed above. Equation S10 shows this Hamiltonian absent the de minimis impact of rapidly-oscillating micro motion, where $$\Omega_i^{(p)}$$

epresents the Raman frequencies of blue or red tones (p=1,2) for the "i"th ion, and $$\phi_p^{(i)}$$

are optical phases for the "i"th ion. $v_p$ are the frequencies of the two tones.

$$H_I = \left(\frac{\hbar}{2}\right)\sum_{i=1}^{N}\sum_{p=1}^{2}\Omega_i^{(p)}\sigma_+^{(i)}e^{i\left(\varphi_p^{(i)}-v_p^t\right)}\exp\left[i\sum_{k=1}^{N}\eta_{ik}\left(a_k e^{-i\omega_k t} + a_k^{\dagger}e^{i\omega_k t}\right)\right] + h.c. \tag{S10}$$

In equation S10, the Lamb-Dicke matrix is defined to be S11:

$$\eta_{ik} = b_{ik}\hbar\delta_k\sqrt{\frac{1}{2M\hbar\omega_k}} \tag{S11}$$

Under weak driving conditions, the Lamb-Dicke coefficients are sufficiently small, and the exponential term in S10 can be expanded to the second order as shown in S12:

$$e^{i\sum_{k=1}^{N}\eta_{ik}\left(a_k e^{-i\omega_k t}+a_k^{\dagger}e^{i\omega_k t}\right)} = 1 + i\sum_{k=1}^{N}\eta_{ik}\left(a_k e^{-i\omega_k t} + a_k^{\dagger}e^{i\omega_k t}\right) - \frac{1}{2}\sum_{k=1}^{N}\sum_{m=1}^{N}\eta_{ik}\eta_{im}\left(a_k^{\dagger}a_m e^{i(\omega_k-\omega_m)t} + a_k a_m e^{-i(\omega_k-\omega_m)t} + h.c.\right) \tag{S12}$$

A simplified interaction Hamiltonian neglecting rapidly oscillating terms is set out in equation S13, using the expression of S14:

$$H_I = -\frac{\hbar}{4}\sum_{i=1}^{N}\Omega_i\sigma_+^{(i)}\left(\sum_{k=1}^{N}\sum_{m=1}^{N}\eta_{ik}\eta_{im}\left(a_k a_m e^{-i\left(\Delta_{mk}t-\varphi_2^{(i)}\right)} + a_k^{\dagger}a_m^{\dagger}e^{i\left(\Delta_{mk}t-\varphi_1^{(i)}\right)}\right)\right) + h.c. \tag{S12}$$

$$\Delta_{mk} = \omega_k + \omega_m - 2(\omega_a + \omega_b) \tag{S14}$$

In an embodiment, the system 100 may adapt mechanisms for controlling degrees of freedom associated with quantum entanglement. The system 100 may use a universal quantum gate family of operations, such as the single-qubit rotations and two-qubit controlled-NOT gate. While such operations are sufficient for general computation, many qubit entangling gates can simplify quantum circuit structures relatively significantly, speed up execution, and extend the power of the system 100, even given decoherence. For example, direct N-qubit operations may have applications in N-bit quantum multipliers, variational quantum algorithms for calculating electronic properties of molecules and materials, and nuclear structure simulations that feature native many body interactions.

Although the present disclosure discusses generating N-body interactions relative to qubits of a trapped ion quantum computing system (which, in the current state of art, is a relatively mature system with respect to qubit coherence, quantum gate fidelity, and scaling potential), one of skill in the art will recognize that embodiments may be adapted to other types of quantum computing platforms, such as atomic qubits and superconducting systems.

Further, the techniques disclosed herein may be extended to execute N-body quantum gate operations between trapped ions using external optical cavities or with the native coupling to phonons, which govern ionic motion in the trap 200, e.g., based on particular engineering of the phonon state (which involves cooling to the ground state).

Figure 5:
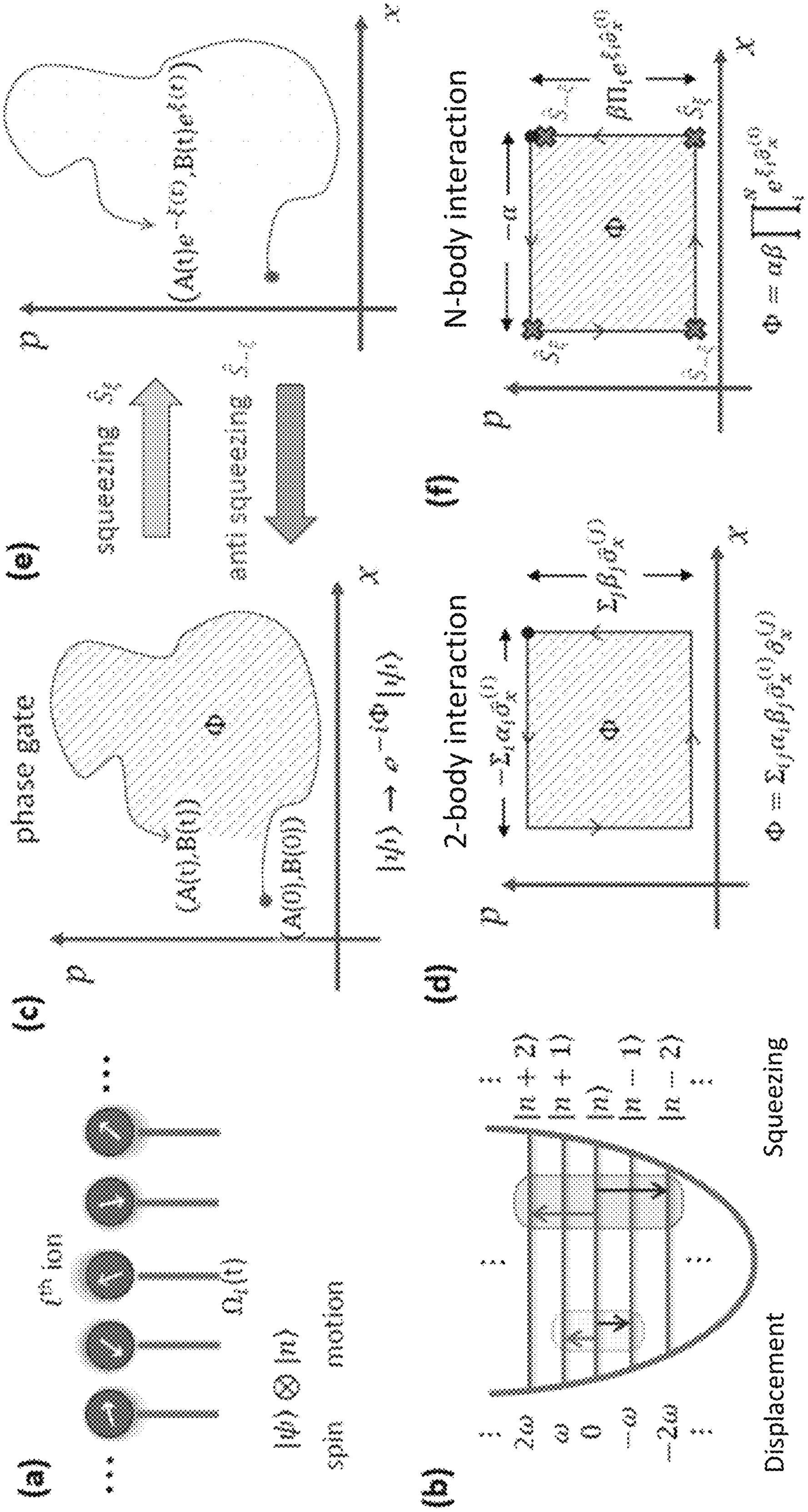
FIG. 5 depicts an application of optically-induced qubit state-dependent forces on a chain of trapped ions, according an embodiment.

Gates between two or more ions use the collective motional modes of the crystal to generate coupling between different spins. The crystal motion is described by vibrational modes of quantum harmonic oscillator, whose excitations are phonons. The Mølmer-Sørensen (MS) gate controllably correlates the state of spins with that of the phonons by application of optically-induced spin dependent forces as illustrated in FIG. 5.

To generate an n-body interaction, the system 100 may apply qubit state-dependent motional-squeezing to targeted ions in the ion chain during a phase gate operation. Qubit state-dependent squeezing can be generated optically using two tones field, tuned on resonance with the second red and blue side-bands at twice the motional frequency of the mode as shown in FIG. 5 at (b).

Setting the amplitudes of the two tones of each beam equal to the Raman frequencies and keeping the relative phase between the tones constant for all ions, the interaction picture spin Hamiltonian resolves to:

$$H_S = \left(\frac{i\hbar}{2}\right)\left(\sum_{i=1}^{N}\eta_i^2\Omega_i\sigma_\varphi^{(i)}\right)\left(e^{-i\delta_\varphi}\hat{a}^2 - e^{i\delta_\varphi}\hat{a}^{\dagger 2}\right)$$

In the presence of this operator, the quantum state evolves by the following squeezing operator:

$$S_\xi(t) = \exp\left(\frac{\xi(t)}{2}\left(\hat{a}^2 - \hat{a}^{\dagger 2}\right)\right)$$

Where the qubit state-dependent squeeze amplitude is $$\hat{\xi}(t) = \sum_i \xi_i(t)\hat{\sigma}_\varphi^{(i)} = \sum_i \eta_i^2 \int_0^t \Omega(\tau)d\tau\hat{\sigma}_\varphi^{(i)}$$

To illustrate the effect of squeezing on a phase gate operation, as an example, assume a scenario in which the system 100 applies displacements and squeezing sequentially. Also assume that the displacements follow a rectangular shaped loop and are spin independent. In such a scenario, the system 100 applies squeezing only at the corners of the rectangle between displacements, as shown in FIG. 5. In this instance, the gate evolution is $$U_{seq}(T) = D_x(-A)S_\xi^\dagger D_p(-B)S_\xi D_x(A)S_\xi^\dagger D_p(B)S_\xi = D_x(-A)D_p\left(-Be^{\hat{\xi}}\right)D_x(A)D_p\left(Be^{\hat{\xi}}\right)$$

Figure 6:
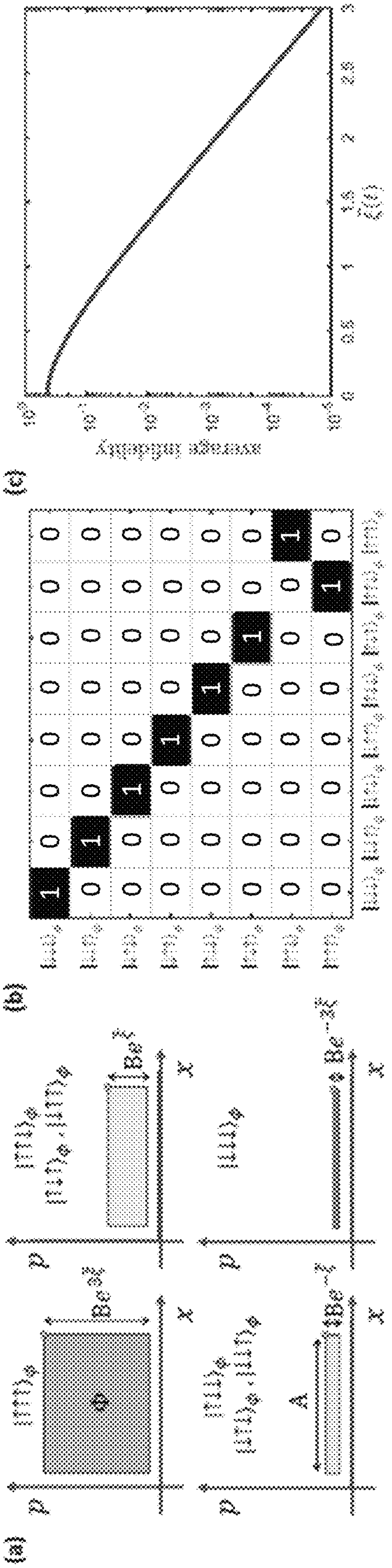
FIG. 6 depicts properties of an example N-body entangling interaction using the techniques described herein in which N is 3, according to an embodiment.

The evolution renders the following effective Hamiltonian $$H_{eff} = \frac{\hbar\Phi}{T} \text{ where } \Phi = AB\cdot\exp(\hat{\xi})$$

represents an exponential phase space area, even under conditions where A and B are spin-independent. The phase space trajectories of this gate for N=3 are illustrated in FIG. 6 at (a) for $\xi_i=\xi$. As shown, the phase space area depends exponentially on the number of spins pointing upwards. At the limit where $\xi\geq 1$, the phase space area is proportional to the state where all spins point upwards, and at certain limits of $\Phi$, the system 100 renders the overall gate operation into a controlled phase gate, flipping the phase of one sequence of states. Doing so results in all spins pointing upwards, without impacting the remaining sequence of states, and enables the construction of an N-bit Toffoli gate $$T_N^{(n)}.$$

This gate flips the nth qubit if and only if all other N−1 qubits point upwards. FIG. 6 at (b) shows the operation of the $$T_3^{(3)}$$

gate for three qubits. FIG. 6 at (c) shows that the gate infidelity is small under moderate squeezing conditions.

Consistent with this result, the system 100 may generate N-body Hamiltonians by simultaneously applying displacements and qubit state-dependent squeezing. The Hamiltonian given by equation S8 is the generator of a displacement operator. To apply qubit state-dependent but motion independent operations on the ions registers, we consider simultaneous application of the squeezing and displacement Hamiltonians. Through such operations, the ions acquire a qubit state-dependent geometric phase that depends on the area of the contour in phase space, and this is independent of motion, as shown below:

$$\frac{(H_{eff}t)}{\hbar} = -\int_0^t F(t')A(t')\cos(\varphi_D(t'))e^{K(t')}dt'$$

During gate operation by the system 100, the state of the spins and motion are entangled. In such an instance, the motional displacements of the spins exponentially depend on the state of illuminated spins in the ion chain. The original motion state of the ions can be used to distill the total evolution operator to one containing no motional operators. Doing so results in a gate that effects only the internal spin-state of the ions through the qubit state-dependent geometrical phase, proportional to the effective realized Hamiltonian Herr erasing the correlations generated between the spins with the motional state.

Figure 7:
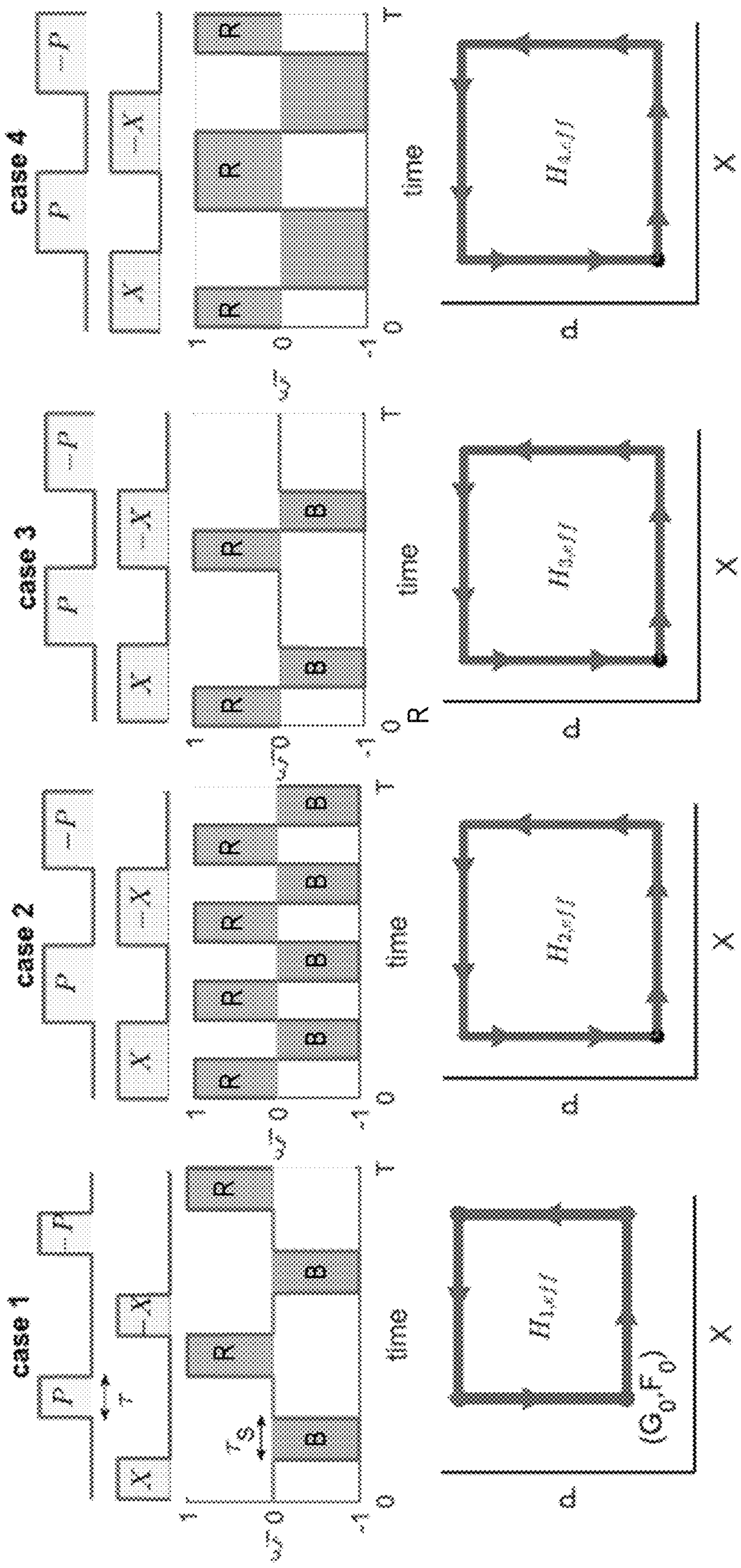
FIG. 7 depicts simulations of Hamiltonians by application of spin-independent displacements and qubit state-dependent squeezing operation for a single motional mode according to an embodiment.

FIG. 7 shows a simulation of Hamiltonians $H_{1,eff}$-$H_{4,eff}$ in parts (a)-(d) by application of spin-independent displacements and qubit state-dependent squeezing operations for a single motional mode. The applied displacement operators are identical in each case, following a rectangular loop in phase space by displacing along a path from x to p to −x to −p. The qubit state-dependent squeezing or anti-squeezing is assumed along the principal axes x, p. The pulses marked as R denote squeezing pulses, while the pulses marked as B denote anti squeezing pulses. Spins are decoupled from motion by the end of the evolution by bringing the ions wave packet to its original displacement in phase space and undoing any motional squeezing throughout the gate.

Figure 8:
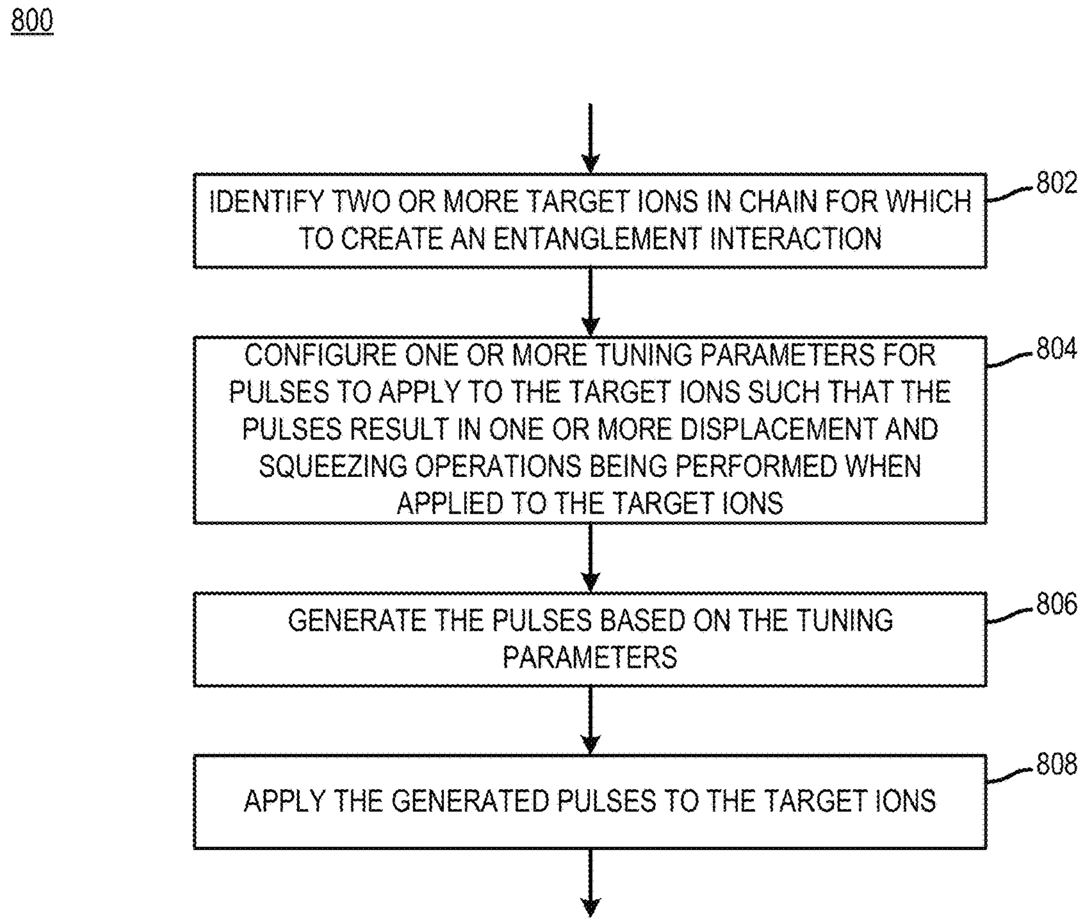
FIG. 8 depicts an example method flow for generating N-body entangling interactions between qubits, according to an embodiment.

FIG. 8 illustrates a method 800, performed by the system 100, for generating an N-body entangling interaction between two or more qubits, according to an embodiment. Note, although the method 800 is described relative to a trapped ion quantum computing system, one of skill in the art will recognize that the method 800 can also be adapted to a variety of quantum computing systems, such as superconducting quantum systems. As an example, method 800 will be described relative to the example use case of FIG. 9 for implementing a 4-body Stabilizer Hamiltonian.

As shown, the method 800 begins in block 802, in which the system 100 identifies two or more target ions in the chain 102 for which to create an entanglement interaction. In this case, assume that N=4 in a chain of 11 ions. The system 100 may use a motional mode p=8 as a parameter for generating the interaction and act on ions 3, 5, 7, and 9 in the chain, in which ions 5 and 7 are used to displace the position of this mode and ions 3 and 9 are used to generate pure qubit state-dependent rotation of phase-space via squeezing operations, as depicted in (a) of FIG. 9.

Figure 9:
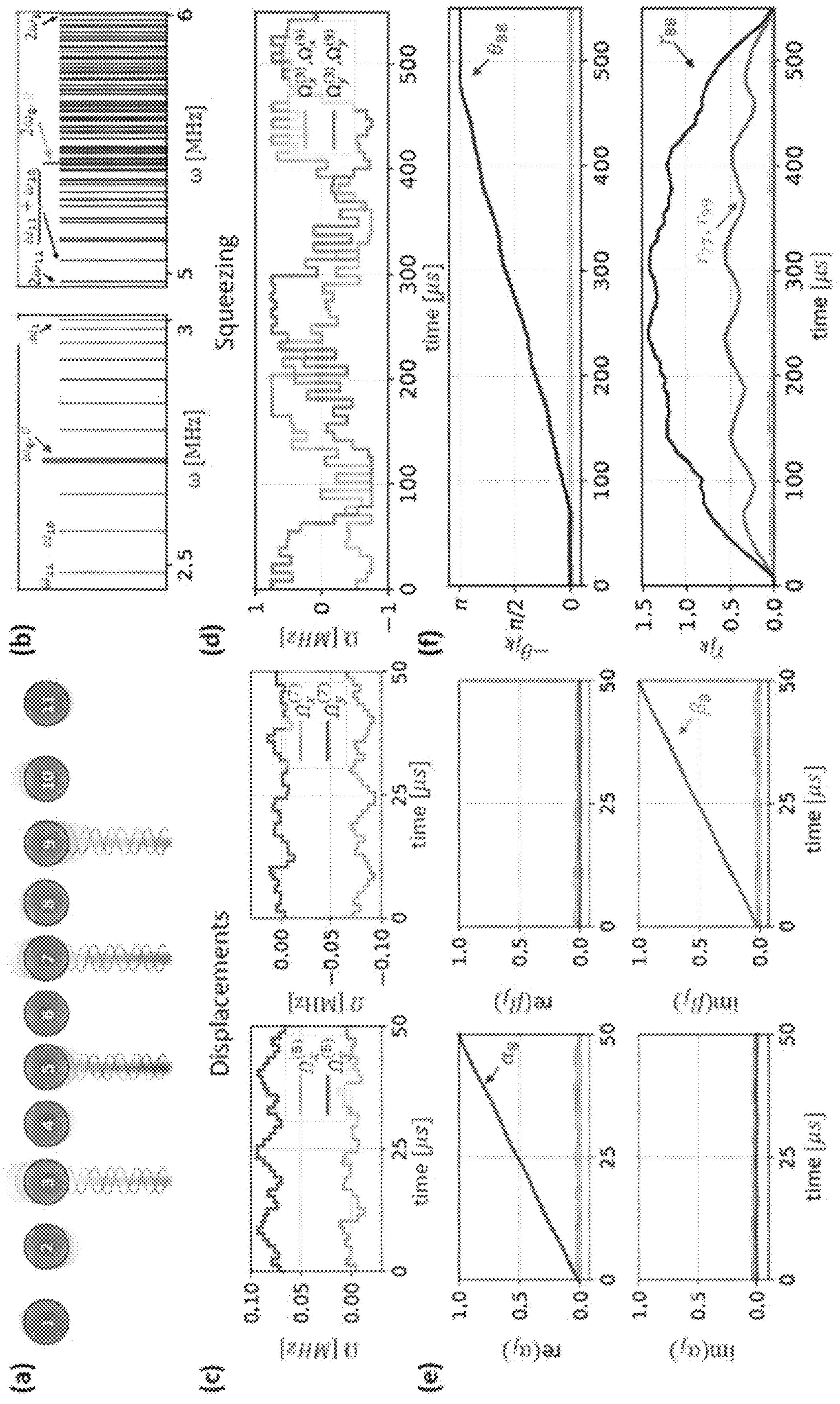
FIG. 9 depicts an example use case in which the quantum computing system of FIG. 1 implements a 4-body Stabilizer Hamiltonian, according to an embodiment.

In block 804, the system 100 configures one or more parameters for pulses to apply to the target ions. More particularly, the system 100 does so such that the pulses result in one or more displacement and squeezing operations are performed when applied to the target ions. For example, the system 100 may configure the parameters for the pulses such that the system 100 applies an alternating sequence of displacement operations and squeezing operations. Continuing the example of FIG. 9, the system 100 tunes the frequency of the pulses towards ions 5 and 7 on resonance with the first sidebands of mode 8 to generate displacement operations, and the frequency of the pulses at 3 and 9 on resonance with the second sidebands of mode 8 to generate squeezing operations. FIG. 9 at (b) shows frequency tuning of displacement and squeezing beams with respect to the first and second sideband transitions, respectively.

In block 806, the system 100 generates the pulses based on the parameters. In block 808, the system 100 applies the pulses to the target ions. FIG. 9, at (c) and (d) depicts a temporal shape of control fields using simultaneous amplitude and phase modulation for displacement pulses of 50 μs and squeezing pulses of 550 μs, respectively. FIG. 9 at (e) and (f) depicts outcome displacements and scaling parameters for the spin state of the ions 3, 5, 7, and 9, particularly in which the spins point upwards. Note that both the target mode and spectrally-nearest modes are squeezed during the pulse yet disentangle nearly perfectly at the end of the pulse. The numerical optimization over squeezing operation waveforms was terminated when the disentanglement infidelity, calculated analytically for the motional ground state and averaged over all spin configurations in the computational basis, was lower than 0.1.

It is to be understood that the present disclosure is not limited to the exact details of construction, operation, exact materials or embodiments shown and described, as obvious modifications and equivalents will be apparent to one skilled in the art. While the specific embodiments have been illustrated and described, numerous modifications come to mind without significantly departing from the spirit of the present disclosure, and the scope of protection is only limited by the scope of the accompanying Claims.

EXAMPLES

Illustrative examples of the technologies disclosed herein are provided below. An embodiment of the technologies may include any one or more, and any combination of, the examples described below.

Example 1 includes a method for generating an N-body entangling interaction between qubits in a quantum computing system, comprising configuring one or more parameters for each of a plurality of pulses to be individually applied to a plurality of target ions in a chain of trapped ions as a series of displacement operations and qubit state-dependent squeezing operations on each of the target ions, each of the trapped ions in the chain defining one of the qubits of the quantum computing system; generating, based on the one or more parameters, each of the plurality of pulses; and applying the generated pulses to the plurality of target ions to create an entanglement interaction between the target ions.

Example 2 includes the subject matter of Example 1, and wherein configuring the one or more parameters comprises configuring a tuning frequency and amplitude of the pulses to drive one or more properties associated with each of the target ions.

Example 3 includes the subject matter of any of Examples 1 and 2, and wherein to drive the one or more properties associated with each of the target ions comprises to drive a quantum state of the respective qubit.

Example 4 includes the subject matter of any of Examples 1-3, and wherein to drive the one or more properties associated with each of the target ions comprises to drive a motion of the respective qubit.

Example 5 includes the subject matter of any of Examples 1-4, and wherein to drive the one or more properties associated with each of the target ions comprises to drive motional transitions for generating the series of displacement and qubit state-dependent squeezing operations.

Example 6 includes the subject matter of any of Examples 1-5, and wherein each of the displacement operations occurs simultaneously with each of the qubit state-dependent squeezing operations.

Example 7 includes the subject matter of any of Examples 1-6, and wherein each of the displacement operations and the qubit state-dependent squeezing operations occur in a specified sequence.

Example 8 includes the subject matter of any of Examples 1-7, and wherein each of the displacement operations occur in a sequential and interleaved manner relative to the qubit state-dependent squeezing operations.

Example 9 includes the subject matter of any of Examples 1-8, and wherein the displacement operations are qubit state-dependent.

Example 10 includes a method for generating an N-body entangling interaction between two or more target qubits of a plurality of qubits in a quantum computing system, comprising generating, by an oscillator of the computing system and for each target, a plurality of a single-tone or multi-tone fields, a first field driving the qubit between its quantum states, a second field driving the motion of the qubit, a third field driving first motional sidebands of the qubit, and a fourth field driving second motional sidebands of the qubit to apply a series of displacement forces and qubit state-dependent squeezing forces on the qubit to entangle the qubit with the other target qubits.

Example 11 includes the subject matter of Example 10, and wherein the application of the displacement forces occurs simultaneously with the application of the qubit state-dependent squeezing forces.

Example 12 includes the subject matter of any of Examples 10 and 11, and wherein the application of displacement forces and qubit state-dependent squeezing forces occur in an interleaved manner within one another.

Example 13 includes the subject matter of any of Examples 10-12, and wherein the displacement forces are determined based on $H_D=\hbar A(x \sin \phi_D + p \cos \phi_D)$ and wherein the squeezing forces are determined based on $H_S=(e^{-i\delta_\phi}\hat{\alpha}^2 - e^{i\delta_\phi}\hat{\alpha}^{\dagger 2})$.

Example 14 includes a quantum computing system, comprising one or more processors; a chain of trapped ions, each of the trapped ions defining a qubit; one or more lasers configured to emit a laser beam that is split into two or more non-copropagating laser beams which are provided to each of the trapped ions; a controller comprising memory storing program code, which, when executed by the one or more processors, causes the quantum computing system to configure one or more parameters for each of a plurality of pulses to be individually applied to a plurality of target ions in a chain of trapped ions as a series of displacement operations and qubit state-dependent squeezing operations on each of the target ions, each of the trapped ions in the chain defining one of the qubits of the quantum computing system; generate, based on the one or more parameters, each of the plurality of pulses; and apply the generated pulses to the plurality of target ions to create an entanglement interaction between the target ions.

Example 15 includes the subject matter of Example 14, and wherein to configure the one or more parameters comprises to configure a tuning frequency and amplitude of the pulses to drive one or more properties associated with each of the target ions.

Example 16 includes the subject matter of any of Examples 14 and 15, and wherein to drive the one or more properties associated with each of the target ions comprises to drive a quantum state and/or a motion of the respective qubit.

Example 17 includes the subject matter of any of Examples 14-16, and wherein to drive the one or more properties associated with each of the target ions comprises to drive motional transitions for generating the series of displacement and spin-dependent qubit state-dependent squeezing operations.

Example 18 includes the subject matter of any of Examples 14-17, and wherein each of the displacement operations occurs simultaneously with each of the qubit state-dependent squeezing operations.

Example 19 includes the subject matter of any of Examples 14-18, and wherein each of the displacement operations and the qubit state-dependent squeezing operations occur in a specified sequence.

Example 20 includes the subject matter of any of Examples 14-19, and wherein each of the displacement operations occur in a sequential and interleaved manner relative to the qubit state-dependent squeezing operations.

The invention claimed is:

1. A method for generating an N-body entangling interaction between qubits in a quantum computing system, comprising:

configuring one or more parameters for each of a plurality of pulses to be individually applied to a plurality of target ions in a chain of trapped ions as a series of displacement operations and qubit state-dependent squeezing operations on each of the target ions, each of the trapped ions in the chain defining one of the qubits of the quantum computing system, wherein each of the displacement operations and the qubit state-dependent squeezing operations occur in a specified sequence;

generating, based on the one or more parameters, each of the plurality of pulses; and applying the generated pulses to the plurality of target ions to create an entanglement interaction between the target ions.

2. The method of claim 1, wherein configuring the one or more parameters comprises configuring a tuning frequency and amplitude of the pulses to drive one or more properties associated with each of the target ions.

3. The method of claim 2, wherein to drive the one or more properties associated with each of the target ions comprises to drive a quantum state of the respective qubit.

4. The method of claim 2, wherein to drive the one or more properties associated with each of the target ions comprises to drive a motion of the respective qubit.

5. The method of claim 2, wherein to drive the one or more properties associated with each of the target ions comprises to drive motional transitions for generating the series of displacement and qubit state-dependent squeezing operations.

6. The method of claim 1, wherein each of the displacement operations occurs simultaneously with each of the qubit state-dependent squeezing operations.

7. The method of claim 1, wherein each of the displacement operations occur in a sequential and interleaved manner relative to the qubit state-dependent squeezing operations.

8. The method of claim 1, wherein the displacement operations are qubit state-dependent.

9. A method for generating an N-body entangling interaction between two or more target qubits of a plurality of qubits in a quantum computing system, comprising:

generating, by an oscillator of the computing system and for each target, a plurality of a single-tone or multi-tone fields, a first field driving the qubit between its quantum states, a second field driving the motion of the qubit, a third field driving first motional sidebands of the qubit, and a fourth field driving second motional sidebands of the qubit to apply a series of displacement forces and qubit state-dependent squeezing forces on the qubit to entangle the qubit with the other target qubits.

10. The method of claim 9, wherein the application of the displacement forces occurs simultaneously with the application of the qubit state-dependent squeezing forces.

11. The method of claim 9, wherein the application of displacement forces and qubit state-dependent squeezing forces occur in an interleaved manner within one another.

12. The method of claim 9, wherein the displacement forces are determined based on $H_D = \hbar A(x \sin \phi_D + p \cos \phi_D)$ and wherein the squeezing forces are determined based on $H_S = (e^{-i\delta_\phi}\hat{\alpha}^2 - e^{i\delta_\phi}\hat{\alpha}^{\dagger 2})$.

13. A quantum computing system, comprising:

one or more processors;

a chain of trapped ions, each of the trapped ions defining a qubit;

one or more lasers configured to emit a laser beam that is split into two or more non-copropagating laser beams which are provided to each of the trapped ions;

a controller comprising memory storing program code, which, when executed by the one or more processors, causes the quantum computing system to:

configure one or more parameters for each of a plurality of pulses to be individually applied to a plurality of target ions in a chain of trapped ions as a series of displacement operations and qubit state-dependent squeezing operations on each of the target ions, each of the trapped ions in the chain defining one of the qubits of the quantum computing system;

generate, based on the one or more parameters, each of the plurality of pulses; and apply the generated pulses to the plurality of target ions to create an entanglement interaction between the target ions.

14. The quantum computing system of claim 13, wherein to configure the one or more parameters comprises to configure a tuning frequency and amplitude of the pulses to drive one or more properties associated with each of the target ions.

15. The quantum computing system of claim 14, wherein to drive the one or more properties associated with each of the target ions comprises to drive a quantum state and/or a motion of the respective qubit.

16. The quantum computing system of claim 14, wherein to drive the one or more properties associated with each of the target ions comprises to drive motional transitions for generating the series of displacement and spin-dependent qubit state-dependent squeezing operations.

17. The quantum computing system of claim 13, wherein each of the displacement operations occurs simultaneously with each of the qubit state-dependent squeezing operations.

18. The quantum computing system of claim 13, wherein each of the displacement operations and the qubit state-dependent squeezing operations occur in a specified sequence.

19. The quantum computing system of claim 13, wherein each of the displacement operations occur in a sequential and interleaved manner relative to the qubit state-dependent squeezing operations.

* * * * *